(12) United States Patent
Moore et al.

(10) Patent No.: US 10,681,835 B2
(45) Date of Patent: Jun. 9, 2020

(54) LATCH ASSEMBLY FOR A COMPUTING DEVICE

(71) Applicant: Hewlett Packard Enterprise Development LP, Houston, TX (US)

(72) Inventors: Earl W. Moore, Cypress, TX (US); James Jeffery Schulze, Houston, TX (US); Joseph Oliver, Houston, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/544,634

(22) PCT Filed: Jan. 20, 2015

(86) PCT No.: PCT/US2015/012009
§ 371 (c)(1),
(2) Date: Jul. 19, 2017

(87) PCT Pub. No.: WO2016/118112
PCT Pub. Date: Jul. 28, 2016

(65) Prior Publication Data
US 2017/0367212 A1    Dec. 21, 2017

(51) Int. Cl.
*H05K 7/14* (2006.01)
*H01Q 1/22* (2006.01)

(52) U.S. Cl.
CPC ......... *H05K 7/1492* (2013.01); *H01Q 1/2258* (2013.01); *H05K 7/1489* (2013.01); *H05K 7/1498* (2013.01); *H01Q 1/2291* (2013.01)

(58) Field of Classification Search
None
See application file for complete search history.

(56) References Cited

U.S. PATENT DOCUMENTS

| | | | | |
|---|---|---|---|---|
| 6,133,884 A | * | 10/2000 | Talvitie | H01Q 1/22 343/702 |
| 6,567,274 B1 | * | 5/2003 | Tusan | H05K 7/1461 361/740 |
| 6,994,192 B1 | * | 2/2006 | Chang | B62H 5/00 188/265 |

(Continued)

FOREIGN PATENT DOCUMENTS

| CN | 102044848 A | 5/2011 |
|---|---|---|
| CN | 103988091 A | 8/2014 |

(Continued)

OTHER PUBLICATIONS

Extended European Search Report, EP Application No. 15879148.7, dated Mar. 13, 2018, pp. 1-7, EPO.

(Continued)

*Primary Examiner* — Xanthia C Cunningham
(74) *Attorney, Agent, or Firm* — International IP Law Group

(57) ABSTRACT

A computing device is disclosed. The example computing device includes an enclosure that houses an electrical component. The example computing device also includes a latch assembly disposed on the enclosure, the latch assembly to facilitate coupling the enclosure to a rack. The latch assembly includes an antenna which is communicatively coupled to the electrical component.

20 Claims, 6 Drawing Sheets

(56) References Cited

U.S. PATENT DOCUMENTS

| | | | |
|---|---|---|---|
| 7,265,968 B2* | 9/2007 | Champion | G06F 1/185 361/679.01 |
| 8,816,857 B2 | 8/2014 | Nordin | |
| 8,854,822 B2 | 10/2014 | Hazzard | |
| 9,214,749 B2* | 12/2015 | Li | H01R 13/62944 |
| 9,554,480 B2* | 1/2017 | Freeman | H01H 3/02 |
| 2002/0022460 A1* | 2/2002 | Lintern | H01Q 1/084 455/97 |
| 2005/0285801 A1 | 12/2005 | Reece et al. | |
| 2006/0089108 A1 | 4/2006 | Lagnado et al. | |
| 2006/0142048 A1 | 6/2006 | Aldridge et al. | |
| 2006/0273962 A1 | 12/2006 | Brench | |
| 2007/0240463 A1* | 10/2007 | Antonucci | E05B 1/0092 70/208 |
| 2008/0137284 A1* | 6/2008 | Flynn | G06F 1/183 361/679.32 |
| 2008/0244052 A1* | 10/2008 | Bradicich | G06F 1/183 709/223 |
| 2009/0108995 A1 | 4/2009 | Tucker | |
| 2010/0277866 A1* | 11/2010 | Chen | G06F 21/74 361/679.57 |
| 2011/0012709 A1* | 1/2011 | Payson | G07C 9/00103 340/5.61 |
| 2011/0202172 A1 | 8/2011 | Hayashi | |
| 2012/0026646 A1 | 2/2012 | Thielmann et al. | |
| 2012/0161938 A1 | 6/2012 | Kilian | |
| 2012/0218076 A1* | 8/2012 | Zacchio | E05B 47/02 340/5.61 |
| 2013/0135811 A1* | 5/2013 | Dunwoody | G06F 1/189 361/679.31 |
| 2014/0254086 A1 | 9/2014 | Li et al. | |
| 2014/0292496 A1 | 10/2014 | Tredoux | |
| 2014/0318198 A1* | 10/2014 | Gokcebay | E05C 3/042 70/278.1 |
| 2015/0228138 A1* | 8/2015 | Simmonds | G06K 7/0008 340/5.61 |

FOREIGN PATENT DOCUMENTS

| | | |
|---|---|---|
| DE | 102006034000 | 1/2008 |
| JP | 2012238253 | 12/2012 |

OTHER PUBLICATIONS

International search Report and Written Opinion received for PCT Application No. PCT/US2015/012009, dated Oct. 20, 2015, 9 pages.

* cited by examiner

104

600

LATCH ASSEMBLY FOR A COMPUTING DEVICE

BACKGROUND

A typical data center may include multiple equipment modules housed in racks. Equipment modules might include servers, disk arrays, routers, and others. In some situations, a user such as a system administrator or technician may want to connect to a particular equipment module at the physical location of the equipment module within the data center. For example, the user may wish to connect to the equipment to provide management instructions or receive diagnostic information from the equipment.

BRIEF DESCRIPTION OF THE DRAWINGS

Certain examples are described in the following detailed description and in reference to the drawings, in which.

DETAILED DESCRIPTION OF SPECIFIC EXAMPLES

The techniques disclosed herein describe a technique for enabling wireless communication in a computing device, such as a rack-mounted computing device. In the examples described herein, a computing device is filled with an antenna that enables wireless communication with a component of the computing device. The antenna is included in a latch assembly, which is also used to couple the computing device to a rack, sometimes also referred to as a chassis. The latch can be made of plastic or any other suitable dielectric material that will not interfere with the antenna. The addition of the antenna to the computing device involves changes to a part of the computing device that can be easily and inexpensively replaced. In this way, the addition of wireless capability can be implemented with few design changes, and existing units can be easily upgraded at reduced cost.

Figure 1:
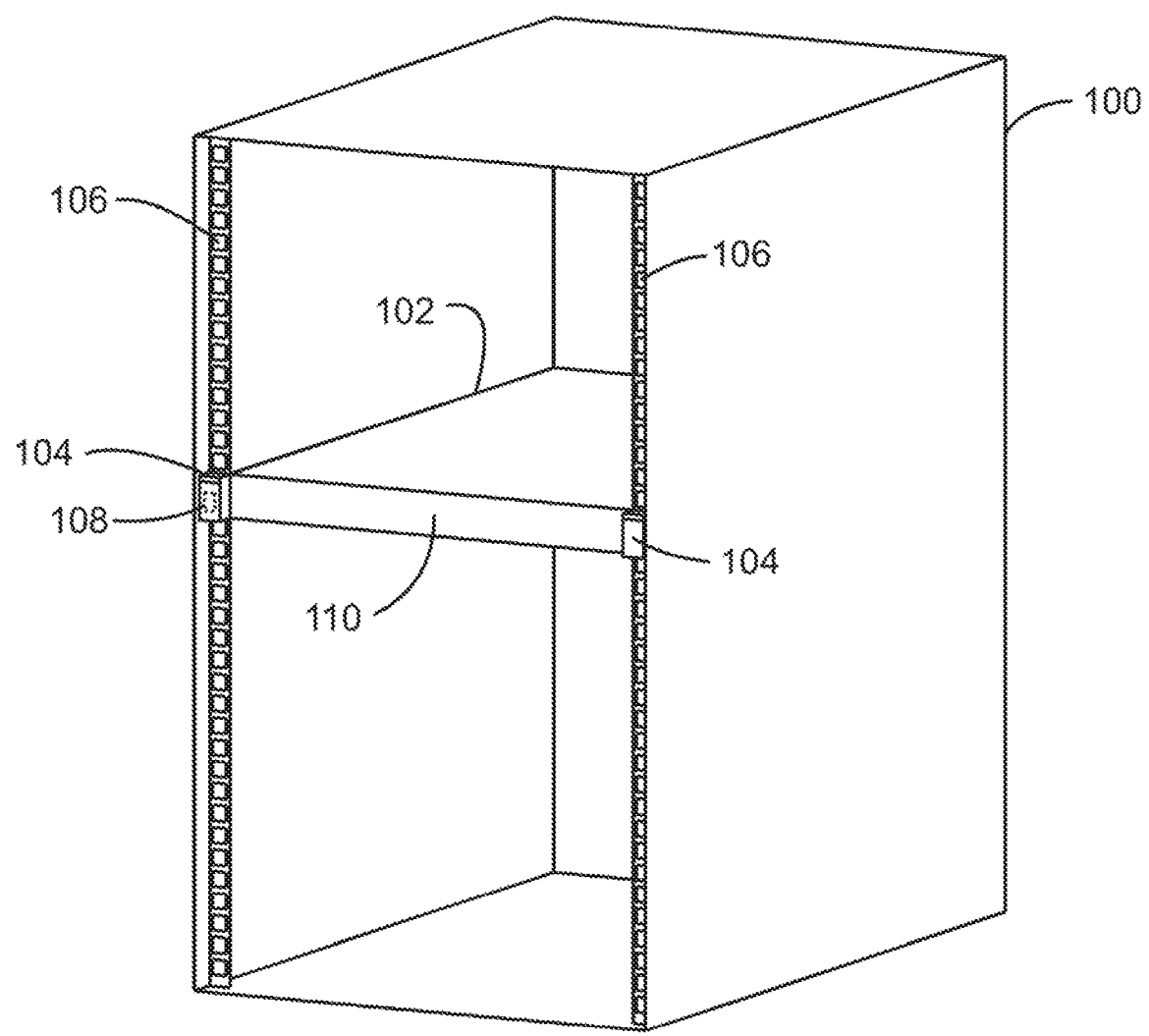
FIG. 1 is a perspective view of an example rack-mounted device with an antenna incorporated in a latch assembly.

FIG. 1 is a perspective view of an example computing device with an antenna incorporated in a latch assembly. The rack 100 serves as an enclosure that can house any number of computing devices 102. Examples of rack-mounted computing devices 102 include servers, storage devices such as disk arrays, power supplies, and networking equipment such as switch arrays, routers, and others. In some examples, the rack 100 may be used in a data center for the centralized storage, management, and distribution of data associated with information technology (IT) operations. In some examples, the rack 100 can include a communications backplane and some data storage and processing resources.

The computing device 102 includes a pair of latch assemblies 104. The latch assemblies 104 are configured to mechanically couple the computing device 102 to the rack 100. In the example shown in FIG. 1, each latch assembly 104 can engage with a mounting surface 106 disposed at the sides of the rack 100. For added support, the rack 100 may include sliding rails to stabilize the computing device 102 during insertion and removal.

One or both latch assemblies 104 may include an antenna 108 that enables wireless communication with a component of the computing device 102. In some examples, the antenna 108 may be a Near-Field Communications (NFC) antenna. However, other types of antennas and communication protocols can be used, including Radio Frequency Identification (RFD), Wifi, bluetooth, and others.

The face 110 of the computing device 102 is the surface that will generally be exposed and accessible when the computing device 102 is installed in the rack 100. Often there is little space on the face 110 of computing device 102 for additional features. By including the antenna 108 in the latch assembly 104, which is disposed on the side of the computing device 102 adjacent to the face 110, the antenna 108 can be included without taking up any space on the front of the computing device 102. Furthermore, when the latch assembly 104 is coupled to the rack 100, the face of the latch assembly 104 is located outside of the metal enclosure of the rack 100. Thus, placing the antenna 108 in the latch assembly 104 may prevent the rack 100 from interfering with proper operation of the antenna 108.

The antenna 108 may enable one-way or two-way communications between a component of the computing device 102 and a user's mobile device, such as a laptop computer, tablet computer, or smartphone. In this way, the user can receive information from the computing device and can send data or commands to the computing device. The information received from the computing device 102 can include diagnostic information, configuration information, identification information, and the like. Data or commands sent to the computing device 102 can include configuration commands, information requests, firmware or software updates, and the like.

In some examples, the computing device 102 is a server with a management controller that provides out-of-band management, and the antenna 108 is electrically coupled to the management controller. Out-of-band management is a computer management technique that enables the user to control the computing device 102 remotely. In out-of-band management, management instructions are received through a communication channel that bypasses the computing device's main processors. Out-of-band management enables an administrator to remotely turn on a computer, update a computer's Basic Input/Output System (BIOS), and monitor computer resources even while a computer's main processor is powered down. An out-of-band management controller is sometimes referred to as a baseboard management controller (BMC) or Integrated Lights-Out (iLO) management controller. One example of the latch assembly 104 is described further below in relation FIGS. 2-5.

Figure 2:
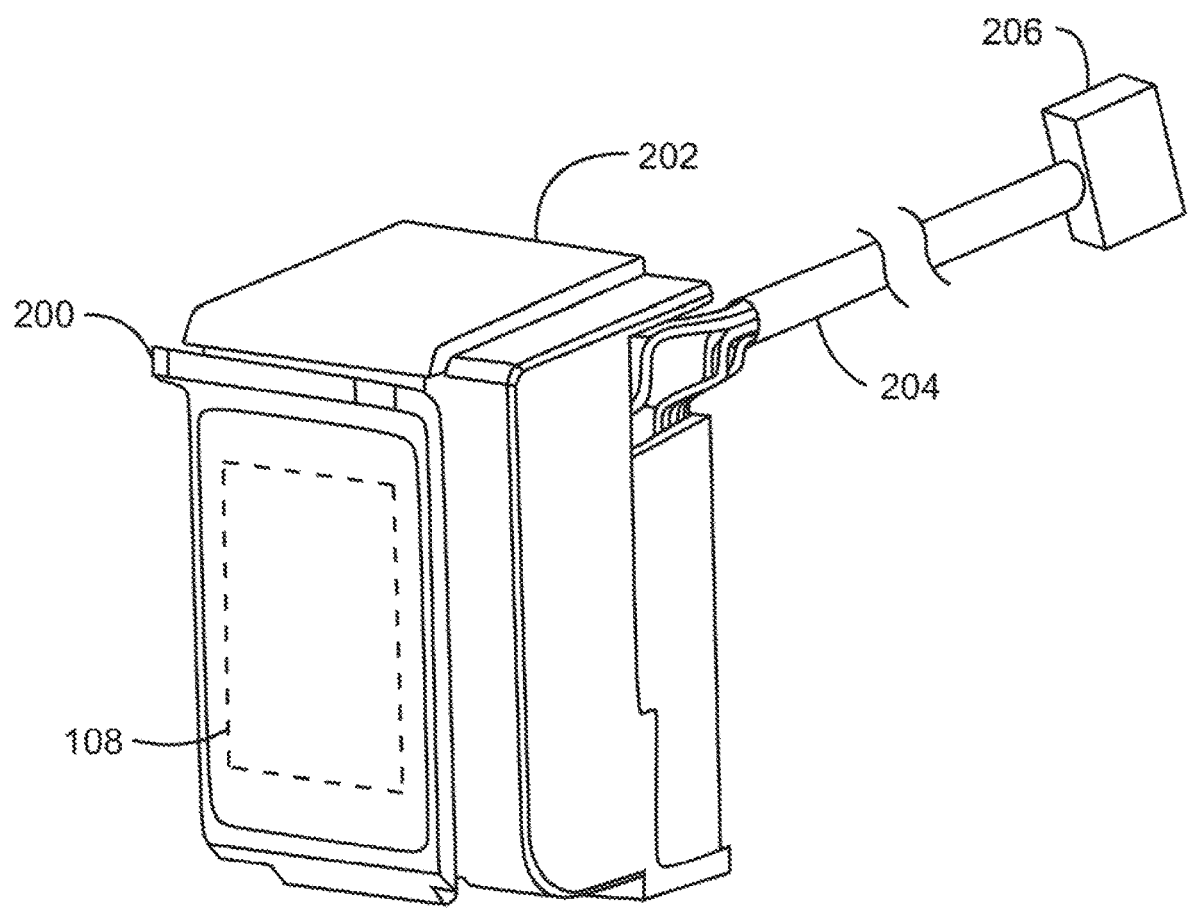
FIG. 2 is a perspective view of the example latch assembly.

FIG. 2 is a perspective view of the example latch assembly. The latch assembly 104 shown in FIG. 2 includes a latch 200 coupled to a latch body 202. The latch body 202 serves as a platform for the other latch assembly components and can be coupled to the side of the computing device 102 shown in FIG. 1. The latch 200 is the portion of the latch assembly 104 that is configured to be actuated by the user to release the latch assembly 104 from the mounting surface 106 of the rack 100. The latch 200 shown in FIG. 1 is actuated by pulling the top portion of the latch 200 outward, which causes the latch to pivot about a pivot point located near the bottom of the latch 200. However, other configurations are also possible, such as a push-button actuating mechanism, for example.

In the example shown in FIG. 2, the antenna 108 is embedded in the latch 200. However, in some example, the antenna 108 may be embedded within some other portion of the latch assembly, such as the latch body 202. In some examples, the antenna 108 may be disposed on an outer surface of the latch 200, either in front of or behind the latch 200. The latch 200 may be formed from any suitable dielectric material to avoid interfering with the antenna. For example, the latch may be made up of any suitable plastic.

The antenna 108 is electrically coupled to a component of the rack-mounted computing device 102 through the cable 204, which may terminate at a connector 206. The cable 204 can include any suitable number of conductors, which may depend, at least in part, on the communication protocol used. The cable 204 is routed from the antenna 108 through the latch body 202, emerging from the back the latch body 202 and running along the length of the computing device 102 to the appropriate component, such as a management controller.

Figure 3:
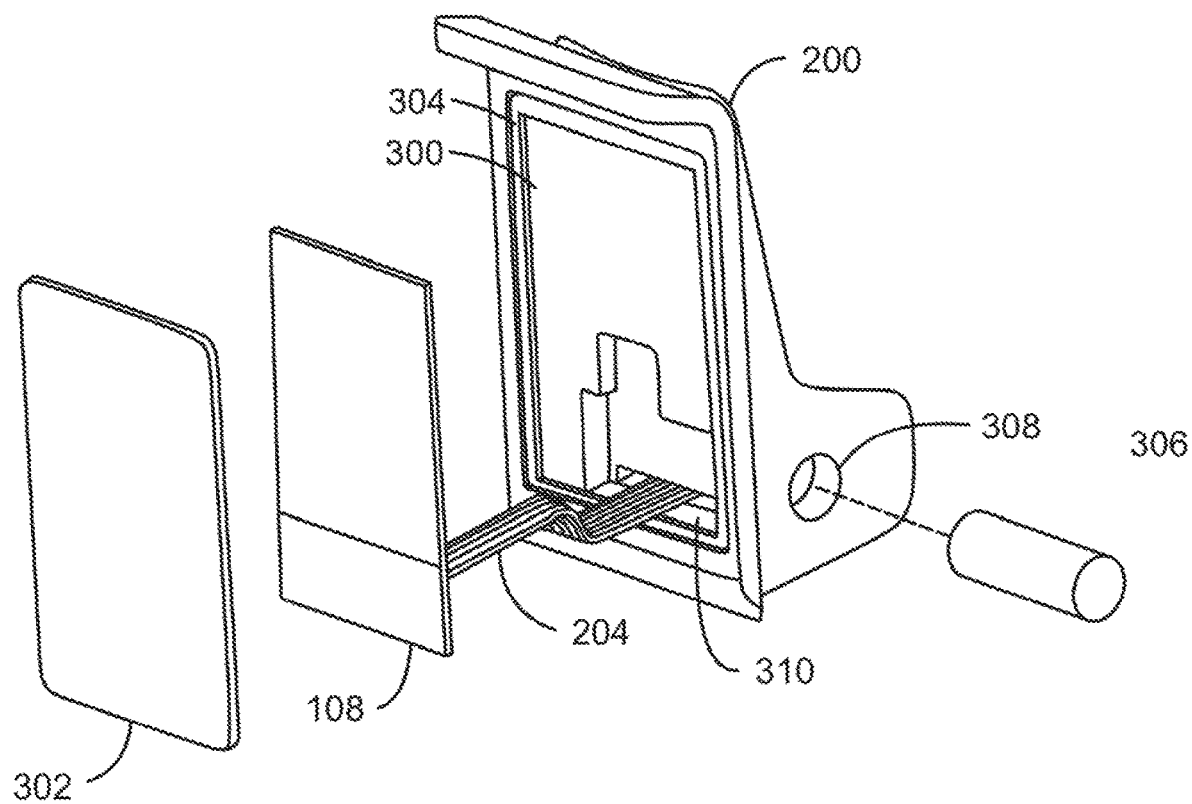
FIG. 3 is an exploded perspective view of the latch portion of the example latch assembly.

FIG. 3 is an exploded perspective view of the latch portion of the latch assembly. As shown in FIG. 3, the front face of the latch 200 includes a recess 300 for receiving the antenna 108 and a cover 302 for enclosing the antenna within the recess 300. Inside the recess 300 and around the periphery of the recess 300 is a shoulder 304 that is approximately the thickness of the antenna 108 or greater. The shoulder 304 provides a surface against which the cover 302 can rest within the recess 300. The cover 302 encloses the antenna within the latch 200 while the shoulder 304 serves as spacer that creates a cavity for the antenna 108 to fit within. In some examples, the cover 302 may snap into place. In some examples, the cover 302 may be sealed in place with an adhesive. The color of the cover 302 can be chosen to match the color of the rest of the latch. The cover 302 may also include ornamentation, such as company logos, communication protocol logos, an antenna symbol, and others.

The latch 200 may be coupled to the latch body (not shown) by a pin 306 that enables the latch 200 to pivot. When assembled, the pin 306 passes through the hole 308, which is located at the pivot point of the latch 200. The back of the latch 200 includes an opening 310 that enables the cable 204 to extend from the antenna 108 out of the latch 200 and into the latch body 202. The opening 310 may be positioned near the pivot point to reduce the movement of the cable 204 during the actuation of the latch 200.

It will be appreciated that the latch 200 is just one latch 200 that can be implemented in accordance with the present techniques and that other configurations are also possible. For example, the lever 200 may be formed around the antenna 108, such as by injection molding.

Figure 4:
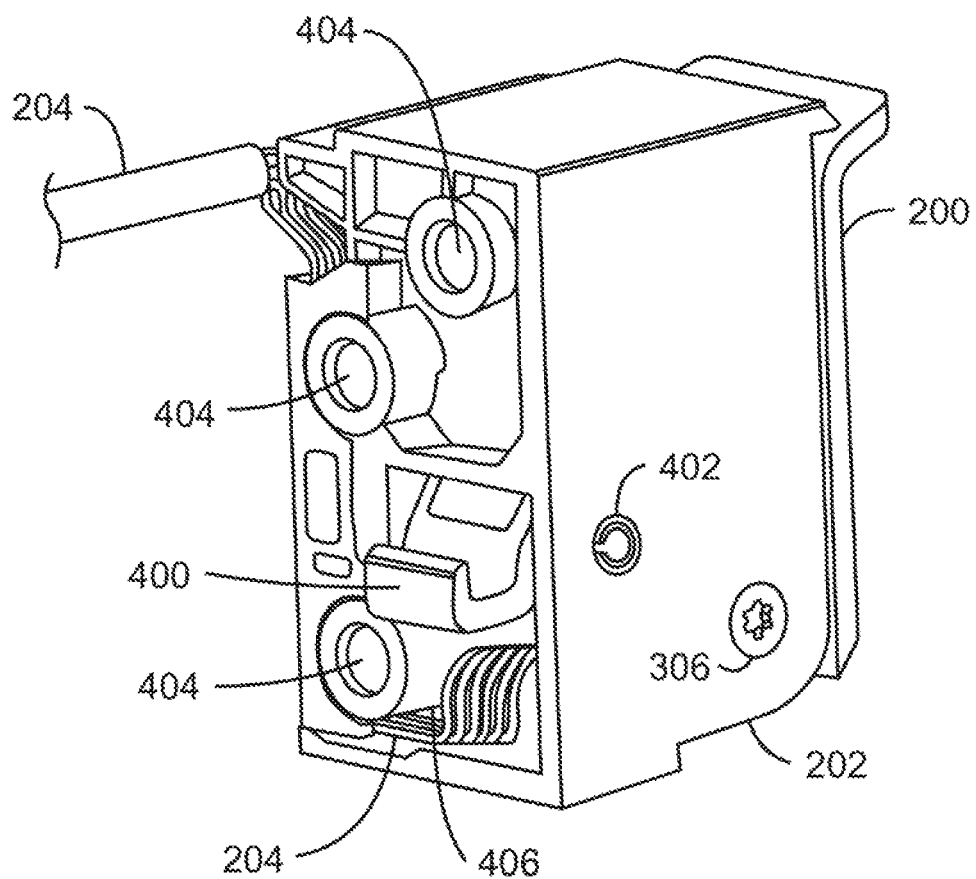
FIG. 4 is a rear perspective view of the example latch assembly.

FIG. 4 is a rear perspective view of the example latch assembly. As seen in FIG. 4, the rear of the latch assembly 104 includes a hook 400. The hook 400 is configured to engage with a corresponding mounting element of the rack 100. For example, with reference to FIG. 1, the hook 400 may be configured to hook to the mounting surface 106 through holes in the mounting surface 106. The hook 400 can be spring loaded so that it automatically snaps into place when inserted. The hook 400 pivots around a mounting pin 402. To remove the computing device 102 from the rack 100, the hook 400 can be disengaged by pulling the latch 200. The rotation of the latch 200 rotates the hook 400, causing it to release the mounting surface 106.

The rear of the latch assembly 104 can also include one or more bolt holes 404, some or all of which may be disposed inside of posts 406. The bolt holes 404 may serve different purposes depending on the design considerations of a particular implementation. One or more bolt holes 404 may be used to couple the latch assembly 104 to the computing device 102. One or more bolt holes 404 may also be used to couple the latch assembly to the rack 100. The number and placement of the bolt holes may vary from what is shown in FIG. 4.

The cable 204 can be routed through the latch body 202 in any suitable manner. In the example shown in FIG. 4, the cable 204 is routed around the bottom of the lower bolt hole post 406 and up along the side of the latch body 202. The example cable routing is shown more clearly in FIG. 5.

Figure 5:
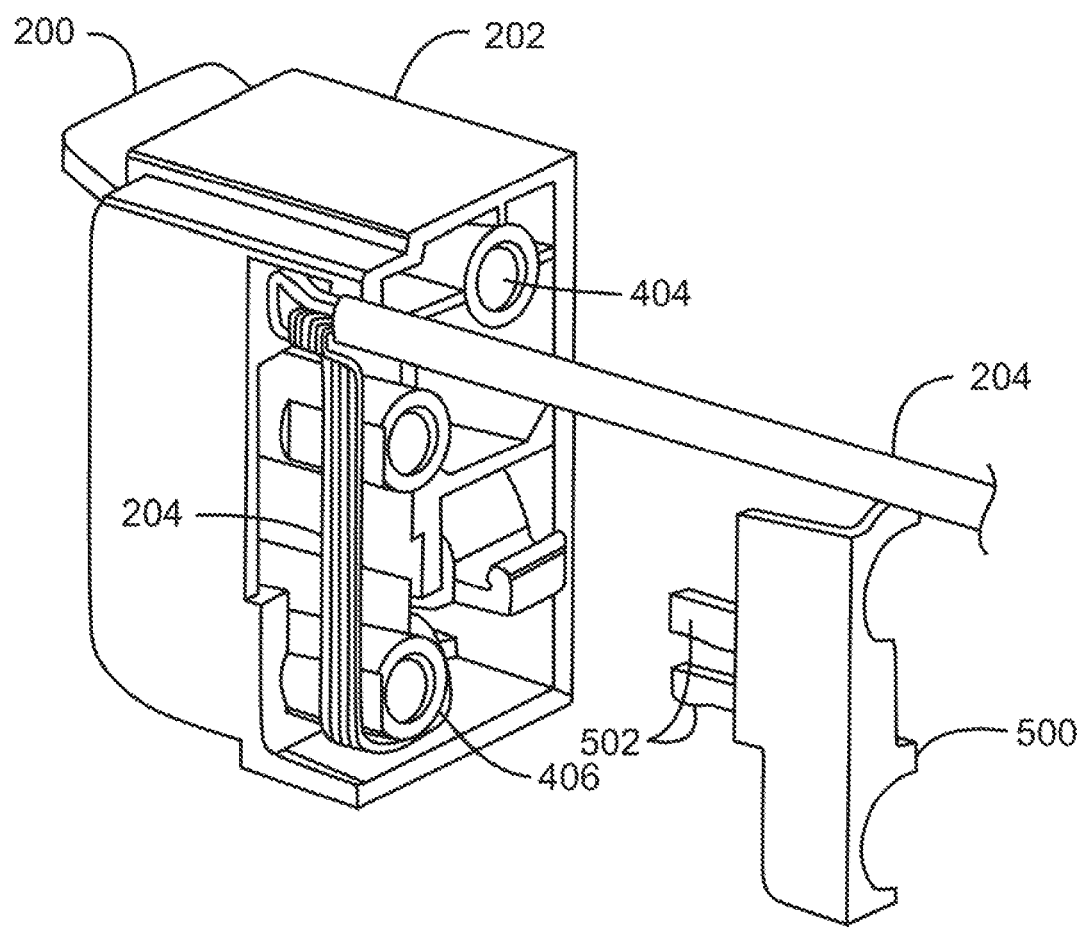
FIG. 5 is another rear perspective view of the example latch assembly showing additional details of the cable routing.

FIG. 5 is another rear perspective view of the example latch assembly showing additional details of the cable routing. As mentioned above, the cable 204 wraps around the bottom of the lower bolt hole post 406 and up along the side of the latch body 202. In some examples, the sides of the bolt hole posts 406 may be flattened to provide space for the cable 204. The side wall of the latch body 202 can be left open in the vicinity of the cable's path to enable the cable 204 to be more easily installed.

The example latch assembly 104 also includes an attachable cable cap 500. The cable cap 500 can be attached to the latch body 202 after the cable 204 has been installed. The cable cap 500 helps to hold the cable in place and protects the cable 204 from damage. The cable cap 500 can be formed to fit the contour of the corresponding mating surfaces of the latch body 202, such as the bolt hole posts 406. The cable cap 500 also proves a gap that the cable 204 can pass through, enabling the cable 204 to exit from the back side of the latch assembly 104. The cable cap 500 can also include one or more tabs 502 by which the cable cap 500 can snap into place.

Figure 6:
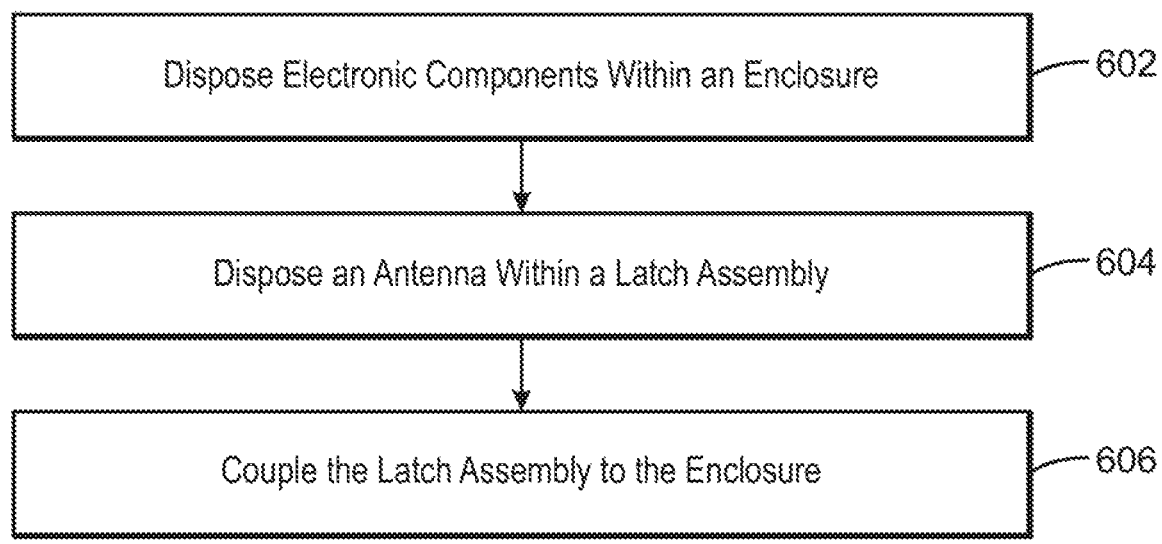
FIG. 6 is a process flow diagram of an example method of manufacturing a computing device.

FIG. 6 is a process flow diagram of a method of manufacturing a computing device. The method 600 may begin at block 602.

At block 602, electronic components are disposed within an enclosure. The electronic components are configured in accordance with the design of a particular computing device. The computing device may be any suitable type of computing device, including a server, a storage array, a processing node, a networking device such as a router or a switch, and any combination thereof, among others. The enclosure is configured to be disposed within a rack and may include one or more mechanical or electrical components that are configured to facilitate being disposed in a rack. For example, the enclosure may include mechanical features that facilitate inserting and securing the enclosure to the rack. The enclosure may also include electrical contacts that mate with electrical contacts of the rack and enable components within the enclosure to be communicatively coupled to other components through a backplane of the rack.

At block 604, an antenna is disposed within a latch assembly. The antenna may be any suitable type of antenna including an NFC antenna, a Radio Frequency Identification (RFID) tag, Wifi, Bluetooth, and others. The antenna may be disposed inside the latch portion of the latch assembly, in other words, the portion of the latch assembly configured to be manually actuated by the user. The latch may be formed of any suitable dielectric that will reduce interference with the antenna, including various types of plastics. The latch may be a molded plastic part that includes a space for disposing an antenna, as shown in FIG. 3. In some examples, the latch may be injection molded around the antenna.

Additionally, although FIGS. 2-5 show the antenna being disposed inside the latch, the antenna may be disposed within any portion of the latch assembly, including inside the latch body. The latch may also be disposed on an external surface of the latch or latch assembly.

At block 606, the latch assembly is mechanically coupled to the enclosure of the computing device. As shown in FIG. 1, the latch assembly may be coupled to a side of the computing device, adjacent to a face of the computing device. For example, the back side of the latch assembly may be bolted to a mounting tab projecting outward from the sides of the computing device. As described above, the latch assembly enables the computing device to be coupled a rack. During block 606, the antenna can also be electrically coupled to a component of the computing device to enable wireless electronic communication with the component through the antenna. The antenna may be electrically coupled to any suitable component, including a baseboard manager, a main processor of a server, a zone manager of a switch, and others.

In some examples, the addition of the latch assembly to the enclosure of the computing device occurs in the course of upgrading the computing device. The computing device may already include one or more standard latch assemblies, i.e., latch assemblies without an antenna. At least one of the standard latches may be removed and replaced with the latch assembly described herein. In this way, existing equipment can be upgraded to add wireless management capability with very few changes to the computing device.

The process flow diagram of FIG. 6 is not intended to indicate that the operations of the method 600 are to be executed in any particular order, or that all of the operations of the method 600 are to be included in every case. Additionally, the method 600 can include any suitable number of additional operations.

The present examples may be susceptible to various modifications and alternative forms and have been shown only for illustrative purposes. Furthermore, it is to be understood that the present techniques are not intended to be limited to the particular examples disclosed herein. Indeed, the scope of the appended claims is deemed to include all alternatives, modifications, and equivalents that are apparent to persons skilled in the art to which the disclosed subject matter pertains.

What is claimed is:

1. A computing device, comprising:
    an enclosure that houses an electrical component; and
    a latch assembly to couple the enclosure to a rack, the latch assembly comprising
        a latch body disposed on and coupled to the enclosure via one or more fasteners;
        a latch to move relative to the latch body to decouple the enclosure from the rack; and
        an antenna disposed in the latch and communicatively coupled to the electrical component.

2. The computing device of claim 1, wherein the computing device is a server.

3. The computing device of claim 1, wherein the electrical component is a baseboard management controller.

4. The computing device of claim 1, wherein the antenna is a Near Field Communication (NFC) antenna.

5. The computing device of claim 1, wherein a face of the latch assembly is disposed outside of the rack when the latch assembly is coupled to the rack.

6. A latch assembly for a computing device, comprising:
    a latch body to be coupled to the computing device;
    a latch to be manually actuated by a user to move relative to the latch body to decouple the computing device from a rack;
    an antenna disposed in the latch;
    a cable coupled to the antenna and to communicatively couple the antenna to a component of the computing device.

7. The latch assembly of claim 6, wherein the latch comprises:
    a recess for receiving the antenna;
    a shoulder for supporting a cover that encloses the antenna within the latch.

8. The latch assembly of claim 7, wherein the latch and the cover comprise a dielectric material.

9. The latch assembly of claim 6, wherein the cable passes from the antenna, through an opening in the latch, into the latch body, and through the latch body to a connector.

10. The latch assembly of claim 6, wherein the latch assembly is to attach to a side of the computing device adjacent to a face of the computing device.

11. A method of manufacturing a computing device, comprising:
    disposing an electronic component within an enclosure;
    disposing an antenna within a latch assembly, the latch assembly including a latch body and a latch to be manually actuated by a user to move relative to the latch body to decouple the enclosure from a rack;
    disposing a mounting pin through at least a portion of the latch body;
    pivotally mounting a hook to the mounting pin, the hook extending outward from a rear portion of the latch body and actuatable by the latch, the hook for coupling the enclosure to the rack; and
    coupling the latch assembly to the enclosure.

12. The method of claim 11, comprising routing a cable from the antenna through the latch body of the latch assembly and communicatively coupling the cable to the electronic component.

13. The method of claim 11, wherein the electronic component is a baseboard manager.

14. The method of claim 11, comprising upgrading the computing device by removing a standard latch assembly from the enclosure prior to coupling the latch assembly to the enclosure.

15. The method of claim 11, wherein the antenna is a Near Field Communications (NFC) antenna.

16. The computing device of claim 1, wherein the enclosure is a chassis.

17. The computing device of claim 1, wherein the computing device includes a pair of latch assemblies that couple the computing device to the rack, each latch assembly configured to couple to opposing sides of the rack.

18. The computing device of claim 1, wherein the latch assembly comprises:
    a mounting pin positioned through at least a portion of the latch body; and
    a hook pivotally mounted to the mounting pin and actuatable by the latch, the hook extending outward from a rear portion of the latch body, the hook for coupling the enclosure to the rack.

19. The latch assembly of claim 6, further comprising:
    a mounting pin positioned through at least a portion of the latch body; and
    a hook pivotally mounted to the mounting pin and actuatable by the latch, the hook extending outward from a rear portion of the latch body, the hook for coupling the enclosure to the rack.

20. The latch assembly of claim 19, further comprising a latch pin that couples the latch to the latch body.

\* \* \* \* \*